(12) United States Patent
Harshaw

(10) Patent No.: US 8,858,015 B2
(45) Date of Patent: Oct. 14, 2014

(54) SOLAR COLLECTION AND ILLUMINATION APPARATUS

(75) Inventor: Bobby F. Harshaw, Ottawa, KS (US)

(73) Assignee: Pivot International, Lenexa, KS (US)

( * ) Notice: Subject to any disclaimer, the term of this patent is extended or adjusted under 35 U.S.C. 154(b) by 453 days.

(21) Appl. No.: 13/154,963

(22) Filed: Jun. 7, 2011

(65) Prior Publication Data

US 2012/0314404 A1    Dec. 13, 2012

(51) Int. Cl.
*F21V 3/02*    (2006.01)

(52) U.S. Cl.
USPC .... 362/183; 362/431; 362/249.02; 362/153.1

(58) Field of Classification Search
None
See application file for complete search history.

(56) References Cited

U.S. PATENT DOCUMENTS

| | | | | |
|---|---|---|---|---|
| 3,476,929 A | * | 11/1969 | Klinger | 362/307 |
| 5,152,601 A | * | 10/1992 | Ferng | 362/183 |
| 5,228,772 A | | 7/1993 | Mitchell et al. | |
| 5,367,442 A | * | 11/1994 | Frost et al. | 362/183 |
| 5,896,712 A | * | 4/1999 | Chao | 52/200 |
| 6,091,020 A | * | 7/2000 | Fairbanks et al. | 136/259 |
| 6,525,668 B1 | * | 2/2003 | Petrick | 340/815.45 |
| 8,069,811 B2 | * | 12/2011 | Ciaccia | 116/173 |
| 2003/0137831 A1 | * | 7/2003 | Lin | 362/183 |
| 2006/0243214 A1 | * | 11/2006 | Van Heygen | 119/267 |
| 2012/0014104 A1 | * | 1/2012 | Morris et al. | 362/249.06 |
| 2012/0113625 A1 | * | 5/2012 | Werner et al. | 362/183 |
| 2012/0287614 A1 | * | 11/2012 | Kajiya et al. | 362/184 |

* cited by examiner

*Primary Examiner* — Sharon Payne
(74) *Attorney, Agent, or Firm* — Dale J. Ream

(57) ABSTRACT

A solar powered illumination apparatus includes an upper housing having an upper optic lens configured to receive high angle solar light energy into an upper housing interior area and having a prismatic lens configured to refract low angle solar energy into the upper housing interior area. A lower housing is attached to the upper housing defining a lower housing interior area in communication with the upper housing interior area. A photovoltaic member is situated adjacent a lower end of the prismatic lens, the photovoltaic member configured to receive the light energy from the upper housing interior area. A battery is electrically connected to the photovoltaic member. Circuitry is situated intermediate the photovoltaic member and the battery for converting the solar energy to electrical energy. A plurality of lights is electrically connected to the battery configured to emit light when energized. The lights are energized only in dim light or darkness.

16 Claims, 9 Drawing Sheets

Example sun trajectory for a 14h day (e.g. LA in summer). 0600h – 2000h

SOLAR COLLECTION AND ILLUMINATION APPARATUS

BACKGROUND OF THE INVENTION

This invention relates generally to solar powered lighting devices and, more particularly, to a solar collection and illumination apparatus configured to harness high angle sunlight as well as to redirect low angle solar light rays onto a photovoltaic surface. The specific configuration of the present invention increases and improves the overall efficiency of the solar collection device.

It has always been a sign of patriotism to display the American flag at one's home or place of business. The desire to display the flag has been heightened in recent years after experiencing acts of terrorism on the United States. Proper flag etiquette requires that an American flag be displayed only during daylight hours unless the flag is properly illuminated after dark. In other words, the flag must be hoisted up a flag pole at dawn and retrieved at dusk unless the flag is properly illuminated.

Traditionally, A/C electrically powered lights are mounted at the base of a flag pole or even on the pole and directed upwardly toward the flag. Although assumably effective for their intended purposes, the existing lighting devices for illuminating a flag include installation of electrical wiring to or adjacent to a flag pole and mounting upward directional lighting from a ground surface. Alternatively, battery powered lights mounted to the finial of the flag pole may be installed. In addition, solar powered lights mounted atop a flag pole have been proposed in order to avoid the ongoing cost of electric lighting.

Although assumably effective for their intended purposes, the existing devices require the expense of initial installation and regular billings for electricity to power the electric lights. Specifically, ground mounted A/C powered lights are usually installed at a significant distance from the flag such that they may be rendered virtually useless in achieving the desired results. All attempts to move an A/C powered light towards the flag increases the installation complexity and cost. It is also understood that A/C powered lights mounted at the top of the flag pole are impractical, expensive, and present maintenance issues.

In addition, even solar lighting may be ineffective or inadequate to power adequate lighting atop a flag pole in that low angle sunlight from early morning and evening sunshine is not harvested efficiently. With specific reference to U.S. Pat. No. 5,896,712, a skylight was proposed having a transparent dome and a light redirecting lens for directing sunlight downwardly into a reflective tube and into a room. Although assumably effective for its intended purpose, the '712 patent teaches that the dome has a low profile configuration that would be inefficient or even ineffective if used to collect photovoltaic solar energy—as proposed in the present invention—in that the low profile dome would result in shadows being cast upon a significant area of a solar collection member. In this way, a significant amount of solar energy would not be harvested and, therefore, unavailable to be store or used to power an electric device such as a light.

Therefore, it would be desirable to have a solar collection and illumination device that efficiently harvests a maximum amount of sunlight, including low angle sunlight. Further, it would be desirable to have a solar collection and illumination apparatus having a prismatic lens for redirecting low angle sunlight onto a photovoltaic material for efficiently powering lights. Further, it would be desirable to have an efficient solar collection and illumination apparatus configured to mount atop a flag pole as a finial ball adapted to illuminate a flag.

SUMMARY OF THE INVENTION

A solar powered illumination apparatus according to the present invention includes an upper housing optical lens configured to mount atop a flagpole like a finial ball and configured to receive high angle solar light energy into an upper housing interior area and having a prismatic lens configured to refract low angle solar energy into the upper housing interior area. The apparatus includes a lower housing optical lens attached to the upper housing and defining a lower housing interior area in communication with the upper housing interior area. A photovoltaic member is situated in the lower housing interior area adjacent a lower end of the prismatic lens, the photovoltaic member configured to absorb the light energy received from the upper housing interior area. A battery is electrically connected to the photovoltaic member. Circuitry is situated intermediate the photovoltaic member and the battery for converting the absorbed light energy to electrical energy. A plurality of lights is electrically connected to the battery and configured to emit light when energized. The apparatus also includes a photosensor configured to allow the lights to be energized only when ambient light outside the housing is beneath a predetermined level.

It is understood that a Fresnel lens is a prismatic lens that redirects light passing through the lens by a predetermined factor and in a direction depending on its design. The Fresnel lens is a prismatic lens that divides a traditional lens into multiple concentric annular sections ("Fresnel zones") for focusing light passing therethrough. This design results in a much thinner and lightweight construction. A Fresnel lens is sometimes referred to as a series of prisms rather than a single prism. A Fresnel lens is useful in the present invention to focus low angle sunlight passing through the lens downwardly onto a properly placed solar cell.

Therefore, a general object of this invention is to provide a solar powered illumination device specifically configured for attachment to a top of a flag pole as a finial ball for illuminating a flag during periods of dim light or darkness.

Another object of this invention is to provide a solar powered illumination device, as aforesaid, in which low angle solar rays are refracted onto a solar panel so as to maximize the efficient collection of solar energy for energizing a plurality of lights.

Still another object of this invention is to provide a solar powered illumination device, as aforesaid, in which the plurality of lights are positioned to completely and evenly light a flag coupled to the flag pole.

Yet another object of this invention is to provide a solar powered illumination device, as aforesaid, having generally hemispherical upper and lower housings for efficiently collecting solar energy and emitting electrically generated light energy, respectively.

A further object of this invention is to provide a solar powered illumination device, as aforesaid, that is easy to install and requires a minimal amount of maintenance or manual effort to operate.

A still further object of this invention is to provide a solar powered illumination device, as aforesaid, that is cost-effective to manufacture.

Other objects and advantages of the present invention will become apparent from the following description taken in connection with the accompanying drawings, wherein is set forth by way of illustration and example, embodiments of this invention.

BRIEF DESCRIPTION OF THE DRAWINGS

FIG. 5b is a sectional view taken along line 5b-5b of FIG. 5a;

DESCRIPTION OF THE PREFERRED EMBODIMENT

Figure 1:
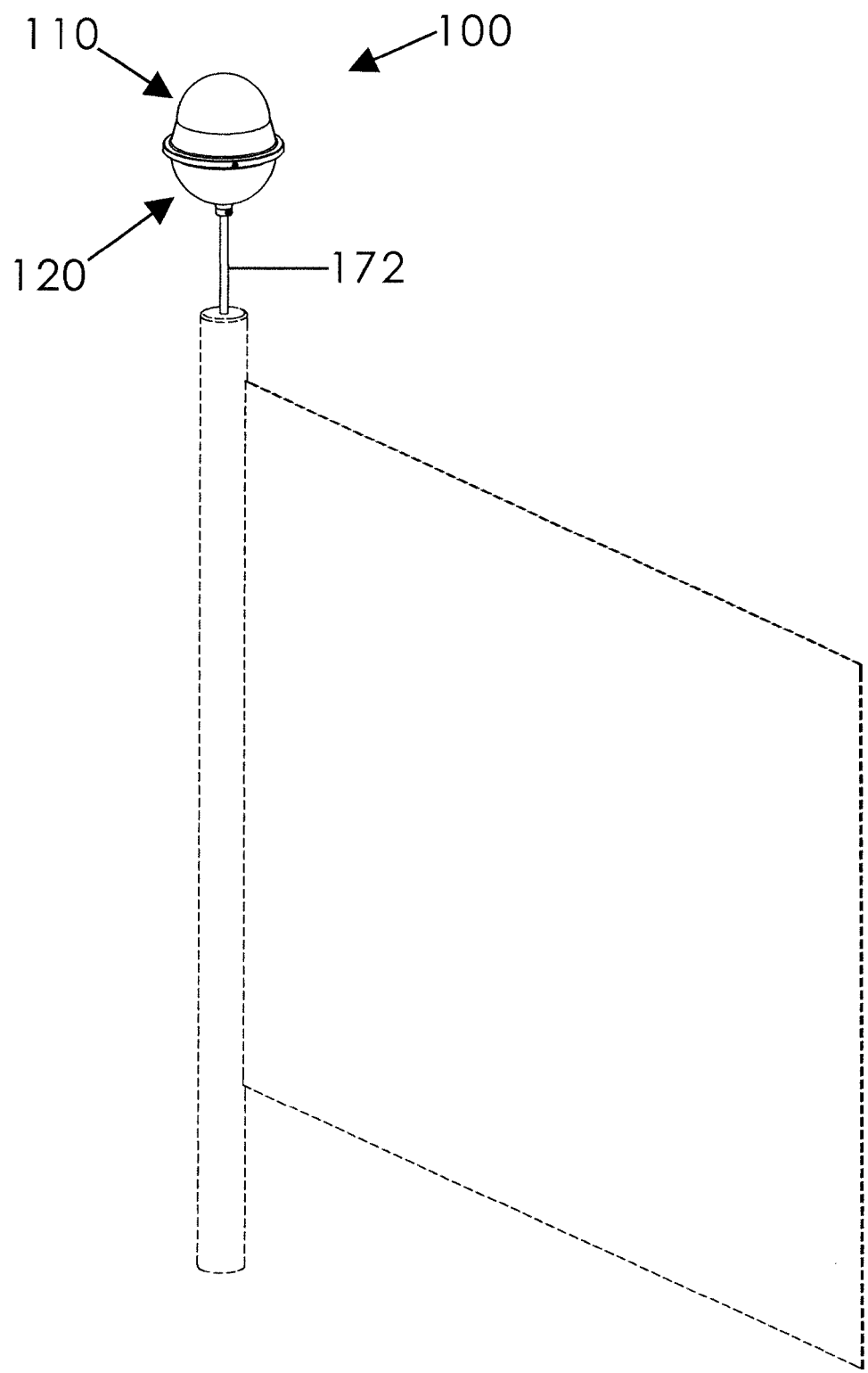
FIG. 1 is a perspective view of a solar powered illumination apparatus according to a preferred embodiment of the present invention shown mounted atop a flagpole.

A solar collector and illumination apparatus according to a preferred embodiment of the present invention will now be described in detail with reference to FIGS. 1 to 6 of the accompanying drawings. The illumination apparatus 100 includes upper 110 and lower 120 housings (together referred to as "the housing") that define an interior area, a light assembly 140 positioned in the interior area that includes a photovoltaic member 142, a battery 144, and a plurality of lights 148. The illumination apparatus 100 is particularly configured for attachment to the top of a flag pole (not shown) so as to illuminate a flag (not shown) coupled to the flag pole during dim or dark conditions using solar energy collected during sunny conditions, as will be described in more detail below.

The solar collection and illumination apparatus 100 includes an upper housing 110 having a generally hemispherical configuration that defines an open bottom 112 and an upper housing interior area. More particularly, the upper housing 110 includes an upper optic lens 114 having a upwardly domed configuration that is constructed of a transparent material. The upper optic lens 114 extends downwardly to a lower circumferential edge 116 (also referred to as an upper optic lens lower peripheral edge). The domed upper optic lens 114 may be constructed of a non-breakable glass, polished plastic, or polymer material. The domed upper optic lens 114 is constructed of a durable material as it may be subjected to harsh weather conditions in use, such as hail, wind, extreme temperatures, and the like. It is understood that the transparent upper optic lens 114 allows high angle solar light rays to enter into the interior area of the upper housing 110. Not only is the domed upper optic lens 114 advantageous for protection of the interior area of the upper housing 110, it is also useful to serve a self-cleaning function with regard to the lens 130 discussed below More particularly, the domed configuration enables its surface to shed the dirt, grime, snow, etc. that typically reduce the performance of a traditional flat lens.

The upper housing 110 includes a circular upper housing mounting member 118, which may also be referred to as an upper mounting member that defines the open bottom 112 of the upper housing 110. The upper mounting member 118 may include an inverted U-shaped configuration into which a complementary lower mounting member 122 may be received, as will be described in more detail later.

The upper housing 110 includes a prismatic lens 130, such as a Fresnel lens, positioned intermediate the upper optic lens 114 and upper mounting member 118 of the upper housing 110 that extends therebetween. Specifically, the prismatic lens 130 may include a prismatic lens upper edge 132 connected to the lower peripheral edge 116 of the upper optic lens 114 and extend downwardly outwardly at a predetermined angle to a prismatic lens lower edge 134 opposite the prismatic lens upper edge 132. The upper mounting member 118, therefore, may be attached to a lower edge of the lens 130. The Fresnel lens is specifically configured so as to refract or redirect low angle solar light rays downwardly within the upper interior area. Preferably, the Fresnel lens 130 includes an exterior surface that is tapered downwardly and outwardly and includes an inner surface having a stepped configuration so as to refract light rays generally downwardly.

It is understood that the upper housing 110 may include other configurations although they may not provide as efficient transmission of light energy downwardly into the upper housing interior area. For instance, the upper optic lens 114 may include a rectangular configuration although it is understood that portions of such configurations may inhibit high angle solar rays from passing directly into the interior area. In some embodiments (not shown), the upper housing 110 may include the prismatic lens 130 extending upwardly and not including a domed upper optic lens 114 at all. In this embodiment, high angle rays are still received into the upper housing interior space, yet without passing through a transparent material.

The illumination apparatus 100 further includes a lower housing 120 preferably having a hemispherical configuration although other configurations would also work. The lower housing 120 defines an open top 124 (FIG. 2) and a downwardly extending domed lower section 126 that includes a transparent construction through which light may pass, such as LED generated light as will be further described later. In some embodiments, the lower housing 120 may include one or more refractive lenses, such as Fresnel lenses, as will also be described later The lower housing 120 may include a lower mounting member 122 having a circular configuration that defines the open top 124. The lower housing mounting member 122 includes a configuration that is complementary to the configuration of the upper housing mounting member 122 such that the lower housing mounting member 122 may be received into the upper housing mounting member 118 in a nested relationship although other fastening means may be included. A seal 143, such as a gasket, may be sandwiched between the upper 118 and lower 122 mounting members so as to enhance the seal therebetween and prevent moisture from entering the interior areas. The lower housing 120 defines a lower housing interior area that is in operative communication with the upper housing interior area when the upper 110 and lower 120 housings are coupled together (the lower and upper housing may collectively be referred to as "the housing"). It is understood that the upper 110 and lower 120 housings may be selectively and removably coupled together so as to access the interior areas, such as to replace a battery 144, as will be described later.

The light assembly 140 is situated in the lower housing 120. The light assembly 140 includes a frame member 141 provides structure configured to secure the other components of the light assembly 140 within the lower housing 120, the major components being secured together with fasteners such as screws. The light assembly 140 includes a photovoltaic member 142 (which may also be referred to as a solar panel), a battery 144, a circuit board 146 (which may also be referred to merely as circuitry), and a plurality of lights 148.

Figure 4:
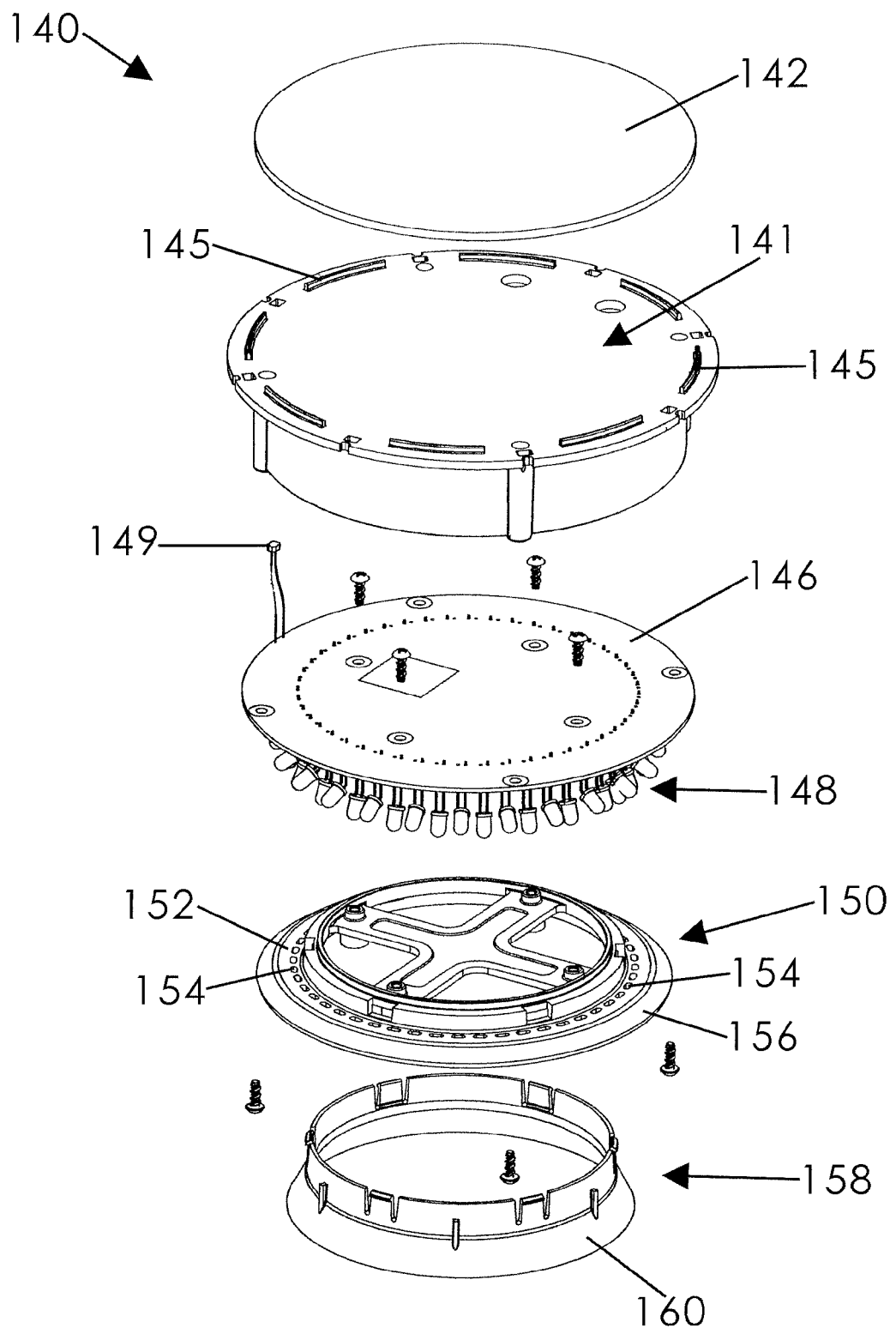
FIG. 4 is an exploded view of the light assembly as in FIG. 3.

More particularly, the photovoltaic member 142 may be positioned atop the frame member 141 adjacent the open top 124 of the lower housing 120 so that light received into the upper housing 110, such as sunlight through the domed upper optic lens 114 and through the prismatic lens 130, is directed onto a top surface of the photovoltaic member 142 and received or absorbed thereby. It is understood that the photovoltaic member 142 is situated adjacent the open bottom of the upper housing 110 when the upper and lower 120 housings are connected together. The frame member 141 may include one or more guide flanges 145 situated adjacent a peripheral edge thereof such that the photovoltaic member 142 may be seated or nested securely atop the frame member 141 (FIG. 4).

It is critical that the diameter of the photovoltaic member 142 is substantially and, preferably, the same as the diameter of the lower peripheral edge 116 of the hemispherical upper optic lens 114 and that they are aligned with one another. To be clear, the diameter of the photovoltaic member 142 is less than the diameter of the lower edge 134 of the prismatic lens 114 which tapers outwardly from the lower peripheral edge 116 of the upper housing 110. Specifically, the diameter of the photovoltaic member 142 is less than that of the lower edge 134 of the prismatic lens 130 because absorbing solar energy in any shadowed region of a solar cell, such as outer peripheral areas of a circular solar panel, is not efficient and, in fact, weakens the link between individual solar cell regions that are traditionally electrically connected in series. In summary, the present invention is configured to minimize or even eliminate the disadvantages that would be experienced if the prismatic lens 130 and photovoltaic member 142 had substantially the same diameter.

In addition, the hemispherical configuration of the domed section 114 of the upper lens 110 is also critical in that a hemispherical configuration reduces or prevents shadows being cast on the photovoltaic member 142. In other words, the configuration of the domed upper lens/section 114 in combination with the diameter relationship of the photovoltaic member 142 described above enables maximum collection of solar energy without the losses of efficiency that would otherwise be expected and experienced.

Circuitry 146 is also situated in the lower housing 120 and electrically connected to the photovoltaic member 142 and is configured to operate as will be described below. The circuitry 146 may include a printed circuit board (referred to with the same reference number" as "circuitry" in general ("PCB"). The light assembly 140 also includes a battery 144 operatively connected to the photovoltaic member 142 although the battery 144 may be connected to the photovoltaic member 142 by way of the circuitry 146 such that the circuitry is intermediate the battery 144 and photovoltaic member 142. In this configuration, the circuitry 146 may include components to convert solar energy received and absorbed by the photovoltaic member 142 into electrical energy that may then be delivered and stored in the battery 144.

Further, the light assembly 140 includes a plurality of lights 148 electrically connected to the battery 144 that emit light when selectively energized by current from the battery 144. Each light 148 may be connected to a lower surface of the circuit board 146 and extends downwardly therefrom. As shown in the drawings, each light 148 may include one or more metal prongs connected to the circuit board 146 (i.e. a "through-mount" design) and, as such, derives electrical power from the battery 144 or from electricity directly converted from received solar energy. Preferably, each light 148 is physically situated such that its light is directed in a predetermined direction different than a predetermined direction of an immediately adjacent light 148. In this way, light from the plurality of lights 148, when energized, provides maximum, balanced, and thorough coverage of an object below the lower housing 120, such as a flag on a flag pole. In other words, the lights 148 are positioned to emit light through the wall of the domed lower section 126 of the lower housing 120. Alternatively, however, all of the lights 148 may be positioned to shine directly downward or some other predetermined direction. In some embodiments, the plurality of lights 148 may be incorporated into a "surface mount" circuit board design in which each light 148 does not include prongs at all. Instead, each light may be redirected through one or more prismatic lenses in predetermined directions so as to illuminate a flag below. In such an embodiment, the lower housing 120 may include one or more refractive lenses (not shown) so as to direct light from the lights in predetermined directions. Preferably, the plurality of lights 148 are light emitting diodes (LEDs) which are advantageous because they provide highly efficient lumen/watt ratio light yet require very little electrical power.

The illumination apparatus 100 further includes at least one photosensor 149, also referred to in the art as a photodiode. It will be appreciated by those skilled in the art that a light emitting diode is an electronic component that detects the presence of visible light or another type of light. The photosensor 149 is electrically connected to the circuitry 146 or circuit board. The circuitry 146 is configured such that the plurality of lights 148 are energized when the photosensor 149 detects an ambient light level indicative of dusk, darkness, or another predetermined threshold light level. In other words, current from the battery 144 is allowed to flow to the lights 148 only when the photosensor 149 indicates that it is sufficiently dark outside the housing. It is understood that the circuitry 146 may alternatively include a simple processor and memory having program instructions that, when executed by the processor, regulate operation of the plurality of lights 148. Preferably, the photosensor 149 may be positioned on the circuit board 146 or on other structure inside the lower housing 120 adjacent the lower housing transparent wall.

The illumination apparatus 100 includes an upper reflector 150 positioned in the interior area of the lower housing 120 (FIG. 4). The upper reflector 150 includes a generally planar portion 152 defining a plurality of apertures 154 spaced apart adjacent a peripheral edge, each aperture 154 configured to receive one of the plurality of lights 148 therethrough. The upper reflector 150 may be coupled to a lower surface of the circuit board 146 such that the plurality of lights 148 extends downwardly through respective apertures 154. The upper reflector 150 may include an upper reflector skirt 156 extending outwardly and downwardly relative to the apertures 154. It is understood that the upper reflector skirt 156 is configured to direct light emitted from the plurality of lights 148 downwardly toward the domed lower section 126 of the lower housing 120 when energized and when aligned and received through the apertures 154. Further, the configuration of the upper reflector skirt 156 prevents emitted light from being directed upwardly into the lower housing interior area.

Figure 5A:
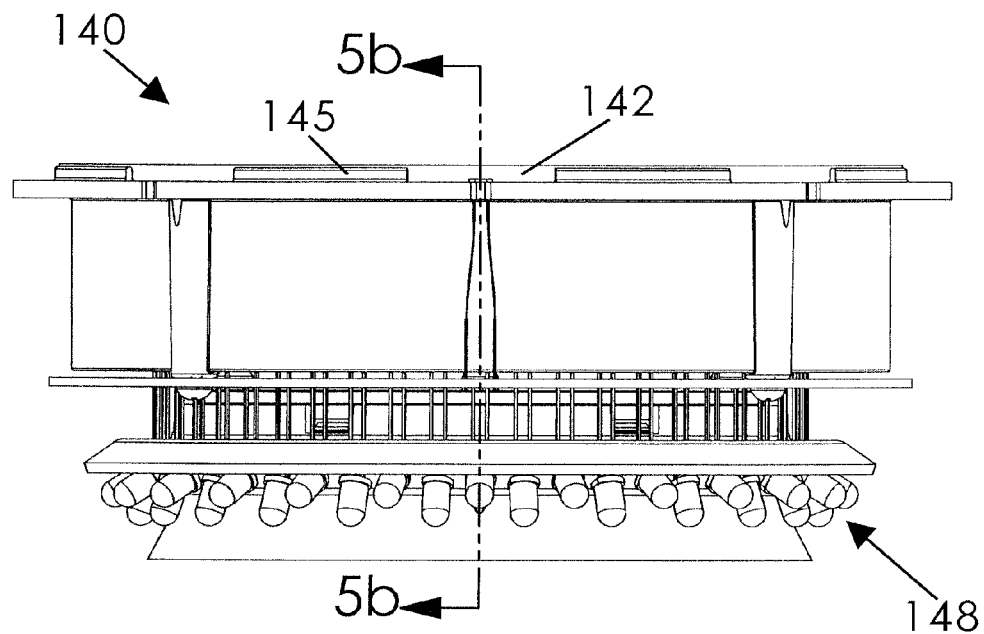
FIG. 5a is a side view of the light assembly as in FIG. 2.
Figure 5B:
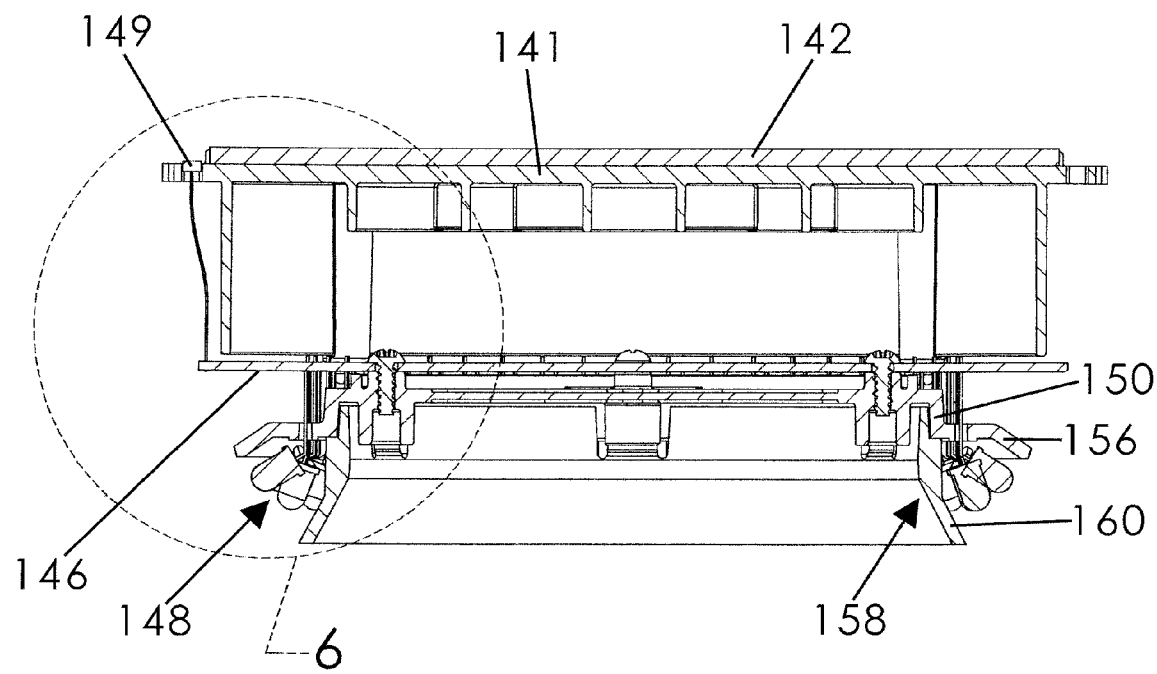
Figure 6:
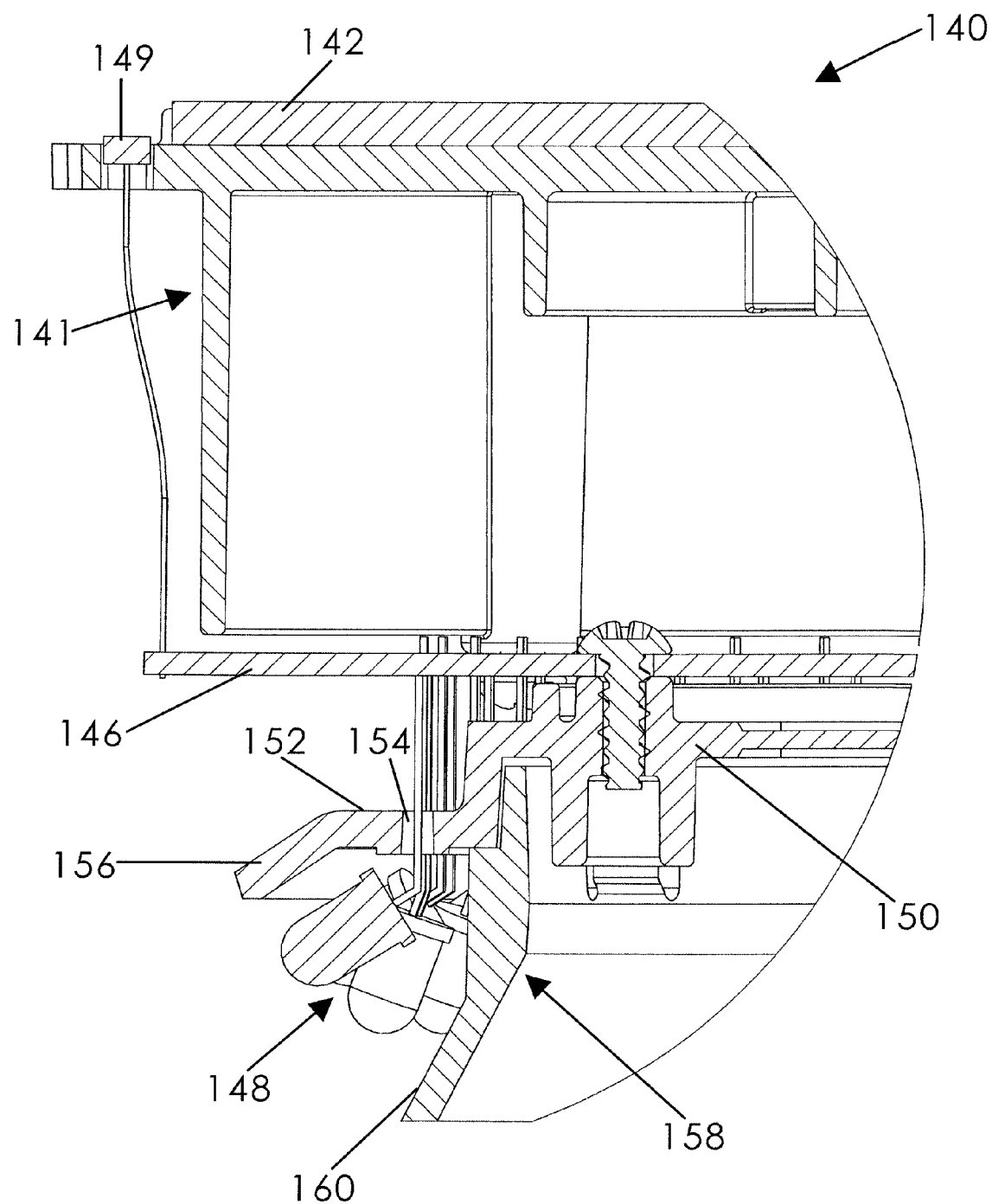
FIG. 6 is an isolated view on an enlarged scale of a portion of FIG. 5b.

The illumination apparatus 100 may also include a lower reflector 158 situated beneath the upper reflector 150 in the lower housing 120. The lower reflector 158 may be coupled to the upper reflector 150 or actually nested in the underneath configuration of the upper reflector 150. In other words, the lower reflector 158 includes a configuration that is complementary to that of the upper reflector 150 so that the upper 150 and lower 158 reflectors may be nested together as shown in FIGS. 5b and 6. The lower reflector 158 also includes a lower reflector skirt 160 having a configuration that tapers downwardly and outwardly about a peripheral edge thereof so as to direct light emitted from the plurality of lights downwardly and outwardly through the transparent construction of the domed lower section 126 of the lower housing 120 (FIG. 6). It is understood that the plurality of lights 148, when assembled as described above, are sandwiched between the upper reflector skirt 156 and lower reflector skirt 160 such that light emitted by the lights 148 is prevented by respective skirts from being communicated above the upper reflector skirt or below the lower reflector skirt 160 into the interior areas of the illumination apparatus housing. Rather, light emitted by the plurality of lights 148 is directed outwardly and downwardly through the transparent material of the domed lower section 126 of the lower housing 120 so as to advantageously illuminate a flag flying on a flag pole, for example. Alternatively, as described above, the lights 148 may be arranged in clusters on surface mount circuitry such that light may be redirected in prescribed directions through one or more prismatic lenses.

Figure 2:
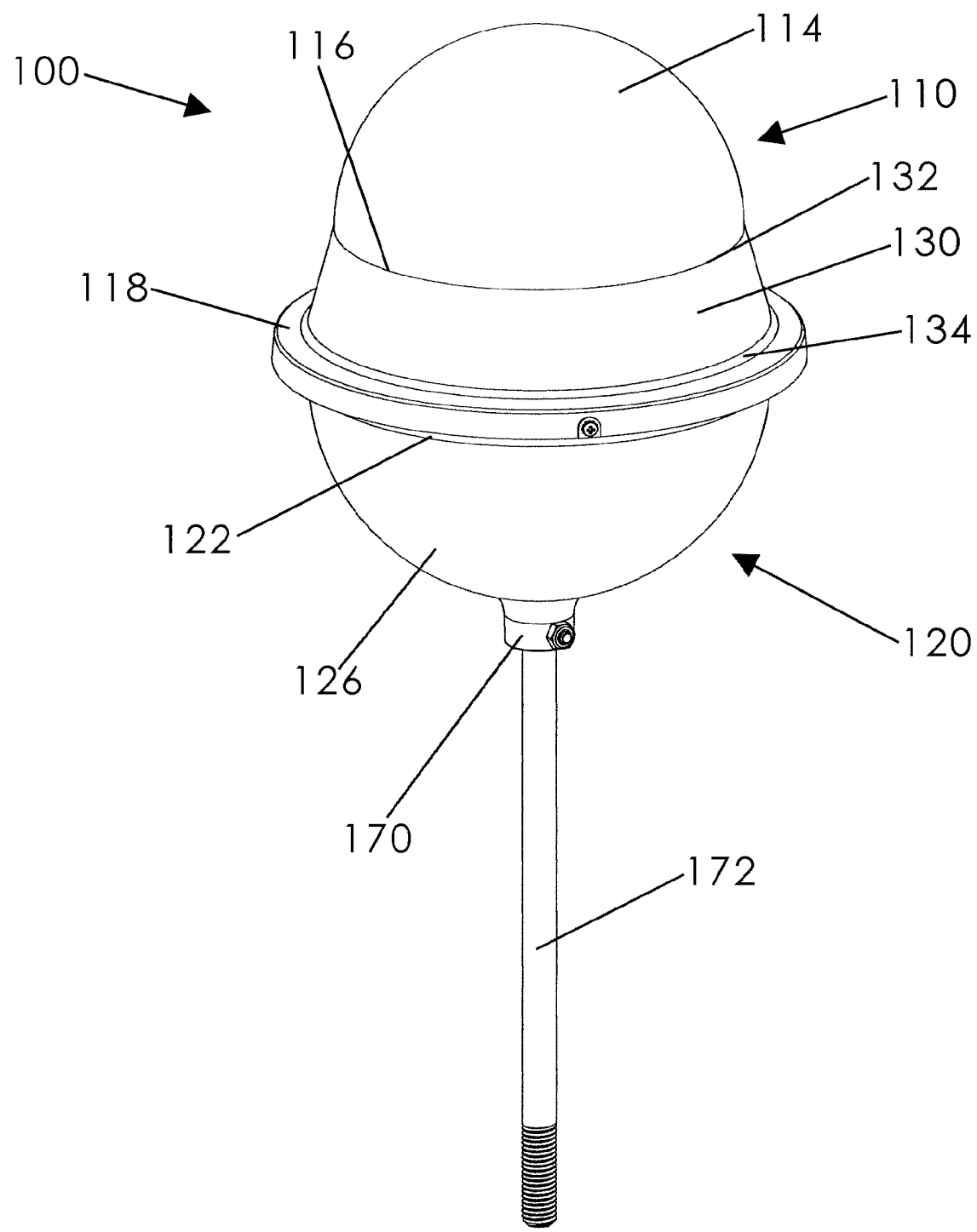
FIG. 2 is a perspective view of the solar powered illumination apparatus as in FIG. 1 removed from the flagpole.
Figure 3:
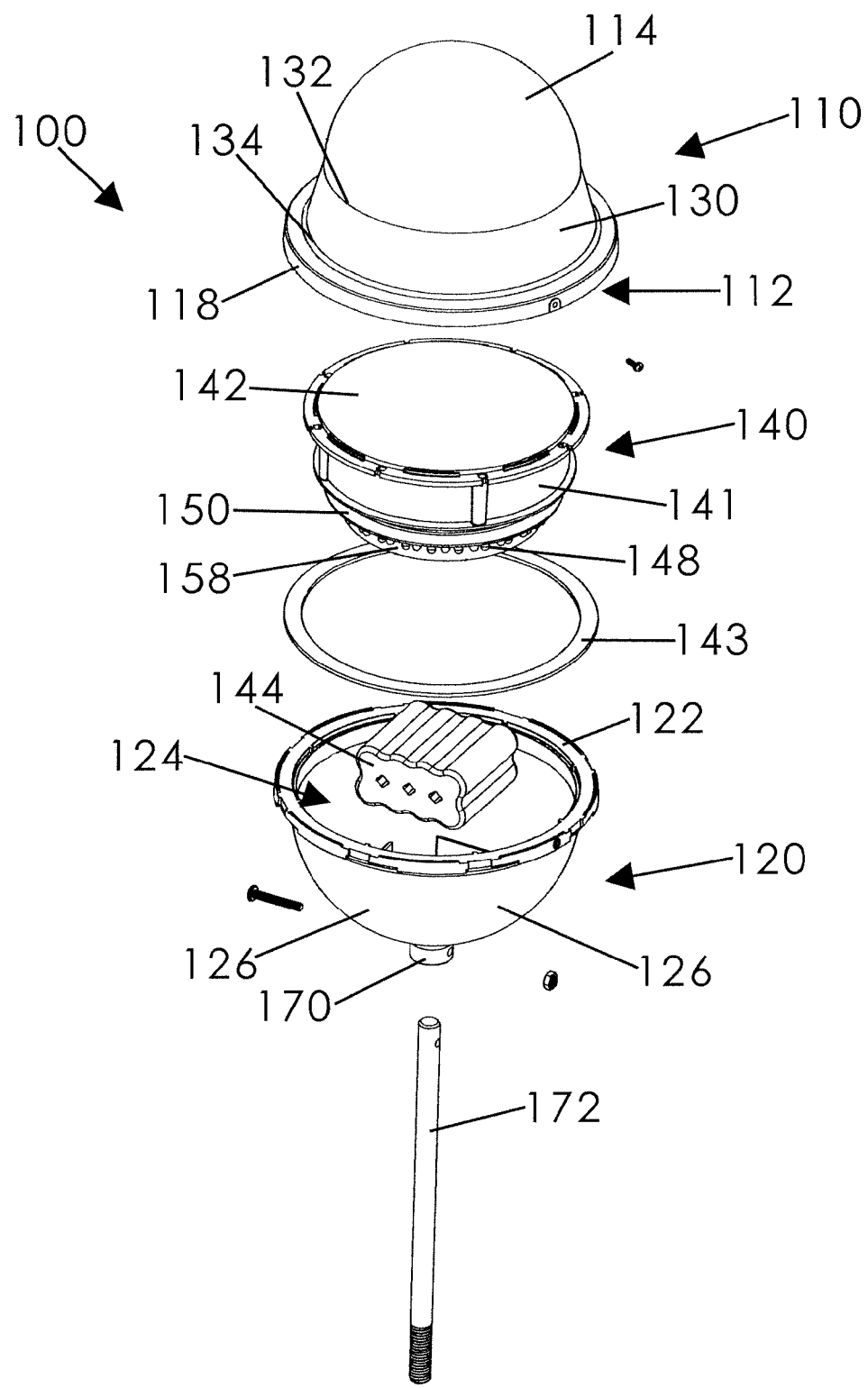
FIG. 3 is an exploded view of the solar powered illumination apparatus.

In addition, the illumination apparatus 100 may include structures for mounting the lower housing 120 to a flag pole (FIGS. 1 and 2). Specifically, a fastener 170 may be coupled to an exterior surface of the domed lower section 126 of the lower housing 120 having a configuration complementary to the top of a flag pole. The fastener 170 may have a tubular body having a threaded structure for coupling to a flag pole in place of a traditional finial. Alternatively, the fastener 170 may be coupled to the flag pole with a pin or other suitable hardware. In still another alternative, the fastener 170 may be configured to attach directly to an existing finial.

Further, the illumination apparatus 100 may include an extension member 172 having a lower end configured to attach to the top of a flag pole and an opposed end configured to be attached to the fastener 170 as described above with an elongate rod portion extending between the ends. The extension member 172 enables the housing to be selectively upwardly displaced from a top of the flag pole, as may be advantageous to more effectively receive solar energy.

In use, the illumination apparatus 100 may be mounted to the top of a flag pole as described above. During periods of relatively high angle sunlight, such as between midday, sunlight may be received through the domed upper optic lens 114 of the upper housing 110 and absorbed by the photovoltaic member 142. During early morning and late afternoon hours, low angle sunlight is received most directly through the prismatic lens 130 and 100% of the low angle sunlight is redirected onto the photovoltaic member 142. The redirected light represents light that would normally not be harvested without the redirectional lens 130. Solar energy harvested by the photovoltaic member 142 is converted by circuitry into electrical energy and stored by the battery 144. When energized by electric current from the battery 144, the plurality of lights 148 emit light through the transparent material of the lower housing 120, the emitted light being carefully directed by the upper 156 and lower 160 reflector skirts so that the emitted light is not lost back into the housing interior areas. The photosensor 149 regulates that the lights 148 are only energized by the battery 144 during periods of dim ambient light. If the battery 144 needs to be replaced or other maintenance, the upper 110 and lower 120 housings may be uncoupled from one another so as to provide access to the interior areas.

Figure 7:
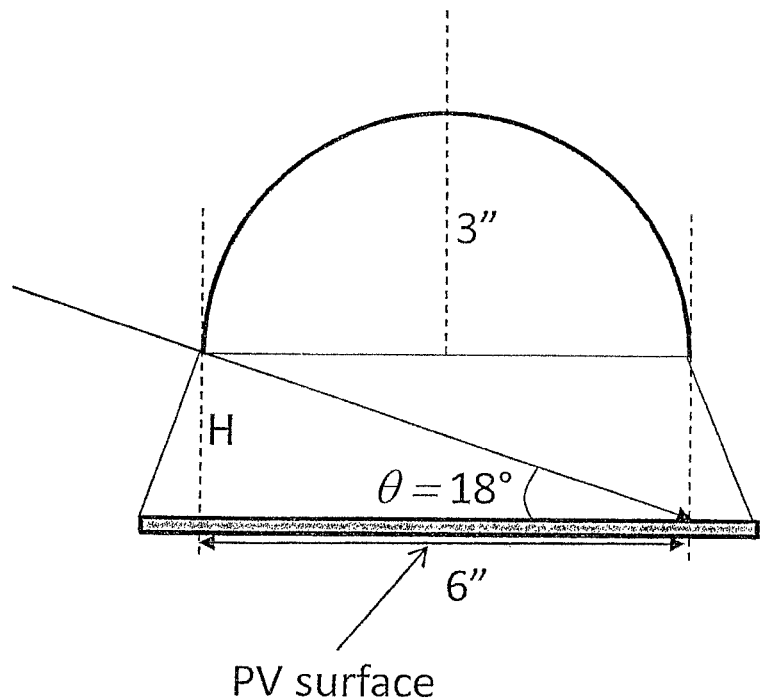
FIG. 7 is a a diagram illustrating the effect of angle on a light solar energy collection device.

The efficacy of the design described above is further strengthened by the examples provided below:

Let's use an illustrative example to explore the effect of a light redirecting skirt (FIG. 7). Example: height of skirt=2". The limiting angle of the ray which just hits the PV surface but misses the skirt is 18°. So, there is no benefit when sun is higher in the sky than 18° from the horizon. When the sun is lower than 18°, then the skirt can redirect some rays which would otherwise miss the PV. We assume 100% redirection of the light.

Figure 8:
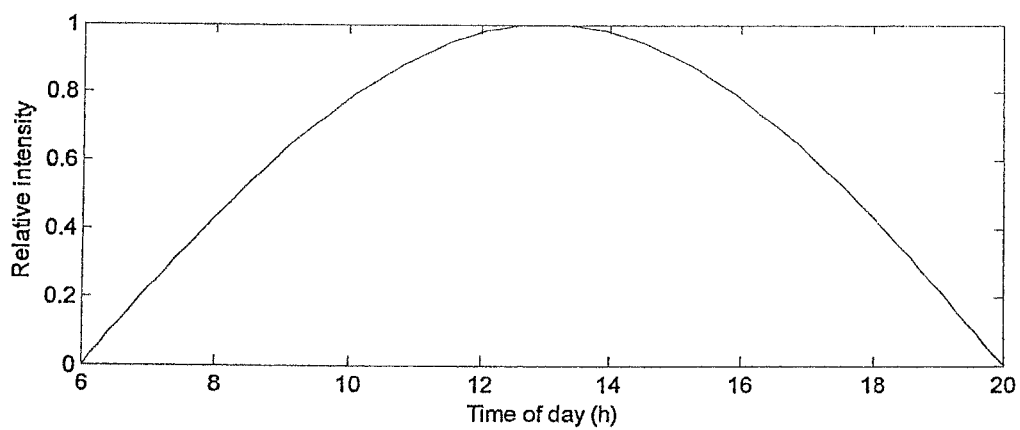
FIG. 8 is a diagram illustrating the relationship of light intensity to the time of day.

The following graph (FIG. 8) shows how the intensity on a horizontal surface diminishes early in the morning and late at night due to the sin θ factor (explained below). The graph reflects a goal for increased light capture of 0600-0800 and 1800-2000 and a sample sun trajectory for a 14 h day (e.g. LA in summer), 0600 h-2000 h.

Figure 9:
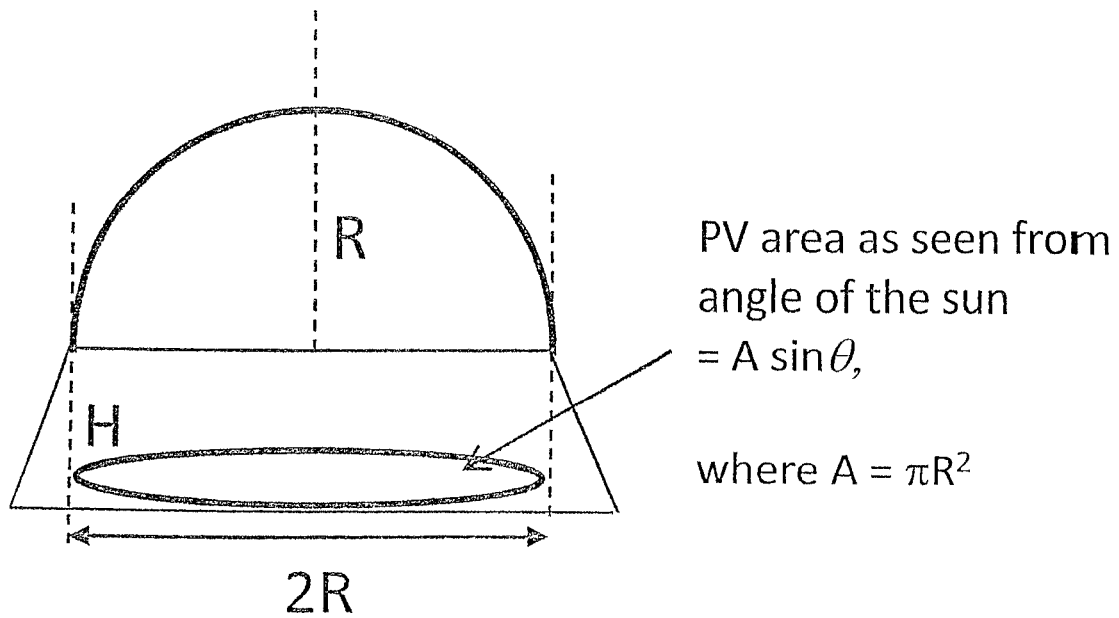
FIG. 9 is a diagram illustrating the geometric area of sunlight collection within a dome and skirt design.

Since the skirt will redirect all the light which captures it, it has an effective cross-sectional area of $A_s$=2RH (simply the area of the rectangle as seen from the side) (FIG. 9). At sun angles such that A sin θ<2RH, we are in a net gain position (i.e. redirection of light that would otherwise miss the PV).

Figure 10:
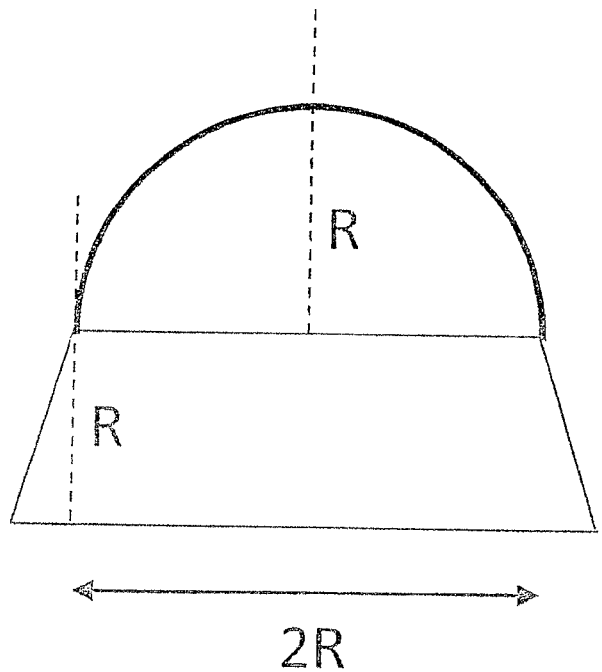
FIG. 10 is another diagram illustrating the efficacy of a solar energy collection device in which the radius and height are equal.

For example, suppose H=R (height of skirt=radius of dome) (FIG. 10). Then A sin θ<2R$^2$, (πR$^2$) sin θ<2R$^2$, sin θ<(2/π), →θ<40°. When the sun is lower than 40°, we make gains. In particular, in the winter, this will have a large effect. However, such a "tall" skirt may be aesthetically unappealing.

In another example, suppose H=R/2, which is probably more aesthetically appealing. The same reasoning as above yields θ<19°. What does this mean for Boston in December? On average, the month of December in Boston reports a sunrise of 0700 h and sunset of 1600 h (FIG. 12).

Figure 12:
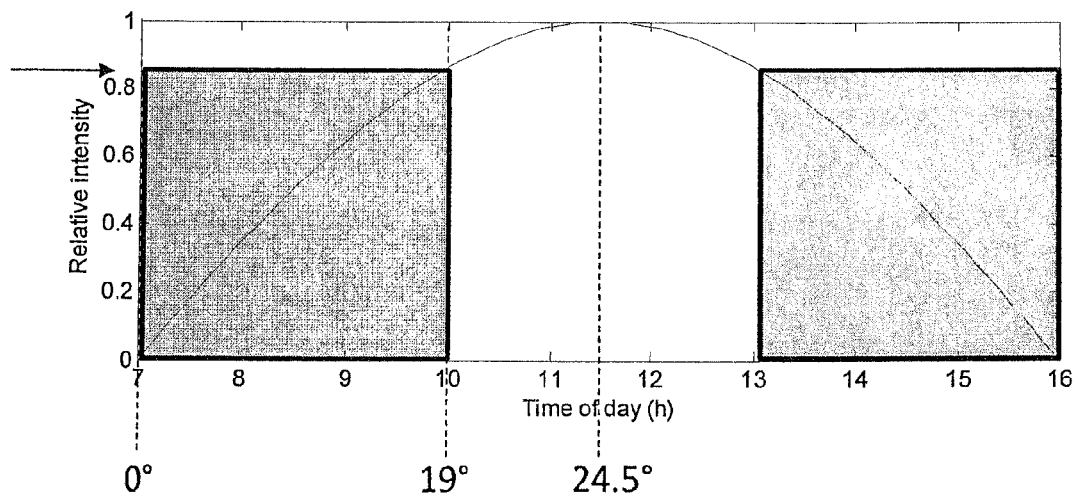
FIG. 12 is a diagram providing a specific example of FIG. 11 applied to Boston, Mass. in the month of December.

This graph demonstrates various sun angles above the horizon (FIG. 12). At 1000 h, sun is at 21° (according to NASA data). So, the gains are substantial. Rather than dropping to 0, the intensity stays fixed at the level shown by the arrow. In energy storage, we would gain the integral of this function (area under the curve), which is approx. the area of the shaded square above (½ for morning and ½ for evening). This is significant—gain of about 40%.

NB—this neglects the fact that near the horizon, the sun intensity is reduced because the light is travelling through more atmosphere. I am considering only geometrical effects here.

Figure 11:
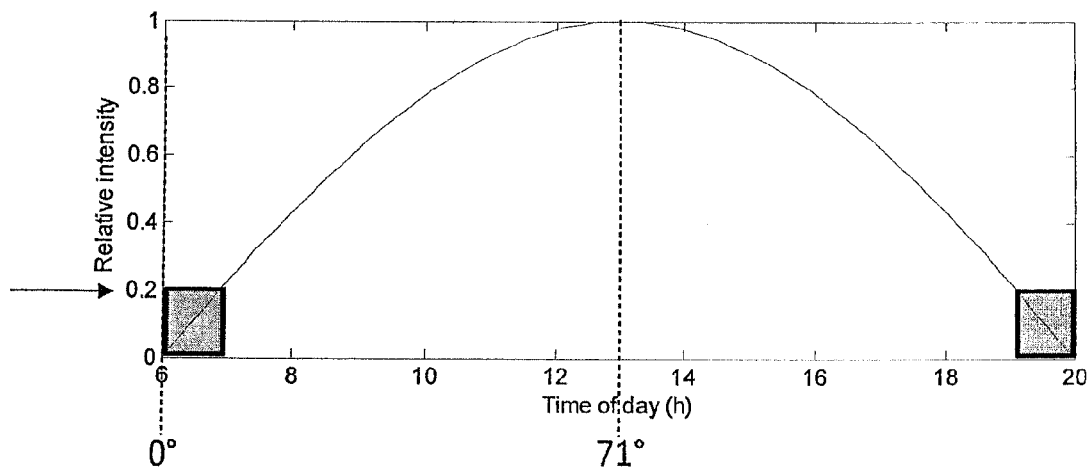
FIG. 11 is another diagram illustrating the relationship of light intensity to the time of day.

What does this mean for LA in June? On average, the month of June in LA reports a sunrise of 0545 h and sunset of 2000 h (FIG. 11).

At 0700 h, sun is at 26° (according to NASA data. So, the MOST we would gain would be the area of the shaded square above (½ for morning and ½ for evening). This is small compared to the whole energy capture.

It is understood that while certain forms of this invention have been illustrated and described, it is not limited thereto except insofar as such limitations are included in the following claims and allowable functional equivalents thereof.

The invention claimed is:

1. A solar collection and illumination apparatus comprising:
an upper housing defining an upper housing interior area, said upper housing including:
a transparent upper optic lens having a hemispherical configuration that defines an apex and an opposed lower peripheral edge, said upper optic lens configured to receive high angle solar light energy from outside said upper optic lens and allow said high angle solar light energy to pass into said upper housing interior area;
a prismatic lens configured to receive low angle solar light energy from outside said upper housing and to refract said low angle solar light energy directionally into said upper housing interior area, said prismatic lens having an prismatic lens upper edge connected to said upper optic lens lower peripheral edge and an opposed prismatic lens lower edge;
wherein said prismatic lens is configured to taper outwardly downwardly from said upper optical lens lower edge at a predetermined angle to said prismatic lens lower edge such that said upper housing defines a generally frustoconical configuration;
a photovoltaic member situated adjacent said prismatic lens lower edge, said photovoltaic member configured to receive said light energy from said upper housing interior area;
wherein:
said photovoltaic member has a circular configuration that defines a diameter that is substantially equal to a diameter defined by said upper optic lens lower peripheral edge;
said diameter defined by said photovoltaic member is smaller than a diameter defined by said prismatic lens lower edge such that said solar light received thereon does not cast a shadow;
a lower housing attached to said upper housing and defining a lower housing interior area in communication with said upper housing interior area, said lower housing having a hemispherical configuration defining an open top in communication with an open bottom of said upper housing;
a battery situated in said lower housing interior area electrically connected to said photovoltaic member; and
a single surface mount circuit board electrically connected to said photovoltaic member and to said battery for converting said received light energy to electrical energy and for delivering said electrical energy to said battery.

2. The illumination apparatus as in claim 1, comprising:
a plurality of light emitting diodes electrically connected to said battery and configured to emit light when energized, said plurality of lights being situated in said lower housing interior area and positioned to emit light through said lower housing;
wherein said plurality of light emitting diodes extend from a lower surface of said single circuit board, each light emitting diode being configured to emit light in a direction different than an immediately adjacent light emitting diode.

3. The illumination apparatus as in claim 1, wherein:
said prismatic lens is a Fresnel lens; and
said plurality of lights are arranged in a cluster on a lower surface of said surface mount circuit board.

4. The illumination apparatus as in claim 1, further comprising a photosensor in data communication with said single circuit board and configured to detect ambient light outside said upper and lower housings; and
wherein said single circuit board is configured to cause said battery to energize said plurality of lights when said photosensor detects less than a predetermined amount of ambient light.

5. The illumination apparatus as in claim 1, wherein said lower housing is one of a substantially transparent optical lens and a refractive lens.

6. The illumination apparatus as in claim 1, further comprising a fastener coupled to an exterior surface of said lower housing configured to couple said lower housing to a top of a flag pole.

7. The illumination apparatus as in claim 6, further comprising an extension member having one end configured to attach to the top of the flag pole and an opposed end configured to attach to said fastener such that said lower housing is upwardly displaced from the top of the flag pole.

8. The illumination apparatus as in claim 2, further comprising:
an upper reflector positioned downwardly adjacent said single circuit board and having a generally circular configuration, said upper reflector having a planar portion defining a plurality of apertures configured to receive said plurality of lights, respectively, said upper reflector including an upper reflector skirt situated outwardly from said plurality of apertures and tapered downwardly and outwardly so as to prevent emitted light from being directed upwardly into said lower housing interior area; and
a lower reflector coupled to a bottom of said upper reflector having a lower reflector skirt tapered downwardly and outwardly so as to direct light emitted from said plurality of lights generally downwardly and outwardly.

9. A solar powered illumination apparatus for use with a flag pole so as to selectively illuminate a flag coupled to the flag pole, comprising:
an upper housing having a generally hemispherical configuration that defines an open bottom, said upper housing including:
a transparent upper optic lens having a hemispherical configuration that defines an apex and an opposed lower peripheral edge, said upper optic lens configured to receive high angle solar light energy from outside said upper optic lens and allow said high angle solar light energy to pass into said upper housing interior area;
a prismatic lens configured to receive low angle solar light energy from outside said upper housing and to refract said low angle solar light energy directionally into said upper housing interior area, said prismatic lens having an prismatic lens upper edge connected to said upper optic lens lower peripheral edge and an opposed prismatic lens lower edge;
wherein said prismatic lens is configured to taper outwardly downwardly from said upper optical lens lower edge at a predetermined angle to said prismatic lens lower edge such that said upper housing defines a generally frustoconical configuration;
a lower housing attached to said upper housing and defining a lower housing interior area in communication with said upper housing interior area, said lower housing having a hemispherical configuration defining an open top in communication with an open bottom of said upper housing;

a light assembly situated in said lower housing including:
- a photovoltaic member positioned adjacent said lower housing open top and configured to receive solar energy from said upper housing interior area; wherein:
  - said photovoltaic member has a circular configuration that defines a diameter that is substantially equal to a diameter defined by said upper optic lens lower peripheral edge;
  - said diameter defined by said photovoltaic member is smaller than a diameter defined by said prismatic lens lower edge such that said solar light received thereon does not cast a shadow;
- a battery;
- a single surface mount circuit board electrically connecting said photovoltaic member to said battery that is configured to convert said solar energy to electrical energy and to deliver said converted electrical energy to said battery; and
- a plurality of light emitting diodes electrically connected to said single surface mount circuit board and to said battery that is configured to emit light when energized, said plurality of light emitting diodes being positioned to emit light downwardly through said transparent domed section.

10. The illumination apparatus as in claim 9, further comprising:
- a photosensor in data communication with said circuitry and configured to detect ambient light outside said upper and lower housings;
- wherein said circuitry is configured to cause said battery to energize said plurality of lights when said photosensor detects less than a predetermined amount of ambient light.

11. The illumination apparatus as in claim 10, wherein said plurality of light emitting diodes extend from a lower surface of said single surface mount circuit board, each light emitting diode being positioned to emit light in a direction different than an immediately adjacent light emitting diode.

12. The illumination apparatus as in claim 9, wherein said plurality of lights are arranged in a cluster on a lower surface of said single surface mount circuit board.

13. The illumination apparatus as in claim 9, further comprising a fastener coupled to an exterior surface of said lower housing having a configuration to attach to the top of a flag pole.

14. The illumination apparatus as in claim 13, further comprising an extension member having one end configured to attach to the top of the flag pole and an opposed end configured to attach to said fastener such that said lower housing is upwardly displaced from the top of the flag pole.

15. The illumination apparatus as in claim 9, further comprising:
- an upper reflector positioned downwardly adjacent said circuit board and having a generally circular configuration, said upper reflector having a planar portion defining a plurality of apertures configured to receive said plurality of lights, respectively, said upper reflector including a upper reflector skirt situated outwardly from said plurality of apertures and tapered downwardly and outwardly so as to direct light emitted from said plurality of lights generally downwardly; and
- a lower reflector coupled to a bottom of said upper reflector having a lower reflector skirt tapered downwardly and outwardly so as to direct light emitted from said plurality of lights generally downwardly and outwardly away from said lower housing domed bottom.

16. The illumination apparatus as in claim 9, wherein:
- said upper optic lens lower peripheral edge defines a diameter substantially equal to a diameter defined by said prismatic lens upper edge;
- said upper optic lens lower edge registers with said prismatic lens upper edge; and
- said outer edge of said photovoltaic member defines a diameter substantially equal to said diameter of said upper optic lens lower peripheral edge.

* * * * *